(12) United States Patent
Ishimaru et al.

(10) Patent No.: US 8,581,110 B2
(45) Date of Patent: Nov. 12, 2013

(54) PRINTED CIRCUIT BOARD AND METHOD OF MANUFACTURING THE SAME

(75) Inventors: Yasuto Ishimaru, Ibaraki (JP); Hirofumi Ebe, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 884 days.

(21) Appl. No.: 12/356,106

(22) Filed: Jan. 20, 2009

(65) Prior Publication Data
US 2009/0194321 A1  Aug. 6, 2009

(30) Foreign Application Priority Data

Jan. 31, 2008 (JP) .................................. 2008-021273

(51) Int. Cl.
*H05K 1/18* (2006.01)

(52) U.S. Cl.
USPC ........................................................ 174/260

(58) Field of Classification Search
USPC ........................................................ 174/260
See application file for complete search history.

(56) References Cited

U.S. PATENT DOCUMENTS

| 5,266,746 | A | 11/1993 | Nishihara et al. | |
| 6,706,972 | B1 * | 3/2004 | Martin | 174/260 |
| 7,265,983 | B2 * | 9/2007 | Frisch | 361/719 |
| 2003/0006509 | A1 | 1/2003 | Suzuki et al. | |
| 2006/0274252 | A1 | 12/2006 | Son | |
| 2007/0013056 | A1 | 1/2007 | Lee et al. | |

FOREIGN PATENT DOCUMENTS

| CN | 1873959 A | 12/2006 |
| JP | 03-052255 A | 3/1991 |
| JP | 05-007057 A | 1/1993 |
| JP | 05152353 A | 6/1993 |
| JP | 2001-119107 A | 4/2001 |
| JP | 2007027682 A | 2/2007 |
| JP | 2008-010615 A | 1/2008 |

OTHER PUBLICATIONS

European Search Report dated Apr. 12, 2010 from the European Patent Office in counterpart European Application No. EP 09 25 0025.
Office Action issued Sep. 29, 2011 in CN Application No. 200910001975.5.
Office Action issued Oct. 30, 2012 in JP Application No. 2008-021273.
Office Action issued Mar. 27, 2012 in JP Application No. 2008-021273.

* cited by examiner

*Primary Examiner* — Chau Nguyen
(74) *Attorney, Agent, or Firm* — Panitch Schwarze Belisario & Nadel LLP (57) ABSTRACT

A mounting region is provided at an approximately center of one surface of an insulating layer. A conductive trace is formed so as to outwardly extend from inside of the mounting region. A cover insulating layer is formed in a periphery of the mounting region so as to cover the conductive trace. A terminal of the conductive trace is arranged in the mounting region, and a bump of an electronic component is bonded to the terminal. A metal layer made of copper, for example, is provided on the other surface of the insulating layer. A pair of slits is formed in the metal layer such that a region being opposite to the electronic component is sandwiched therebetween. Each slit is formed so as not to divide the metal layer into a plurality of regions.

13 Claims, 7 Drawing Sheets

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Conventionally, a COF (Chip On Film) mounting technique has been known as a technique for mounting electronic components such as an LSI (Large Scale Integration) on a film-like substrate. In general, the substrate for COF (hereinafter referred to as the COF substrate) has a two-layer structure of an insulating layer made of polyimide and a conductive pattern made of copper. Terminals are formed on the conductive pattern. Terminals (bumps) of the electronic components are bonded to the terminals of the conductive pattern.

With a finer pitch of the COF substrate and higher performance of the electronic components, a heating value at the time of driving increases. This causes problems such as a malfunction of the electronic components in some cases; therefore, it is important to carry out sufficient heat dissipation. Thus, it is proposed to provide a metal layer for heat dissipation on a back surface (a surface to which the electronic components are not bonded) of the COF substrate.

In a tape circuit board disclosed in JP 2007-27682 A, for example, the metal layer is formed, below a chip mounting region, on a lower surface of a base film.

Figure 7:
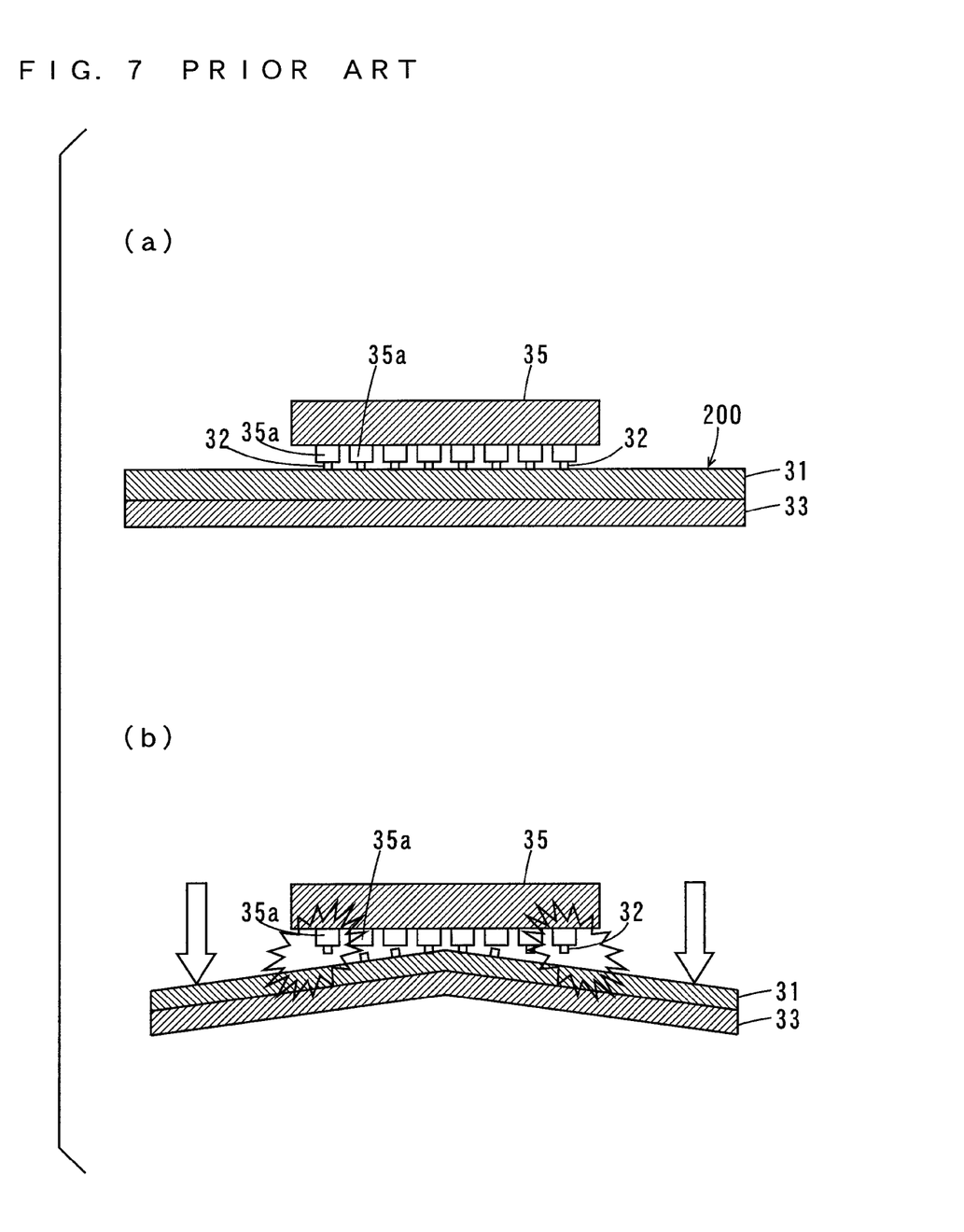
FIG. 7 is a schematic sectional view of a conventional COF substrate provided with the metal layer.

FIG. 7 is a schematic sectional view of a conventional COF substrate provided with the metal layer. In the COF substrate 200 of FIG. 7, conductive traces 32 are provided on one surface of the insulating layer 31 while the metal layer 33 is provided on the other surface. The bumps 35a of the electronic component 35 are bonded to terminals of the conductive traces 32.

Such a configuration causes heat of the electronic component 35 to be dissipated through the metal layer 33. When the electronic component 35 is mounted on the COF substrate 200, or when the COF substrate 200 is used being folded, however, a stress locally applied to part of the metal layer 33 is propagated to the entire COF substrate 200 through the metal layer 33. This causes the entire COF substrate 200 to be bent. Accordingly, part of the conductive traces 32 are detached from the insulating layer 31 to be disconnected, and the bumps 35a of the electronic component 35 are separated from the conductive traces 32 in some cases as shown in FIG. 7 (b). Thus, good connection between the electronic component 35 and the conductive traces 32 of the COF substrate 200 cannot be sustained.

SUMMARY OF THE INVENTION

An object of the present invention is to provide a printed circuit board having improved heat dissipation while sustaining good connection with an electronic component and a method of manufacturing the same.

(1) According to an aspect of the present invention, a printed circuit board having a mounting region on which an electronic component is to be mounted includes an insulating layer, a conductive trace that is formed on one surface of the insulating layer and to be electrically connected to the electronic component, and a metal layer that is formed on the other surface of the insulating layer and has one or plurality of openings, wherein the one or plurality of openings are arranged in a region of the metal layer outside a region, which coincides with the mounting region, of the metal layer and formed such that the metal layer is not divided.

In this printed circuit board, the electronic component is connected to the conductive trace formed on the one surface of the insulating layer. The heat of the electronic component is dissipated through the metal layer formed on the other surface of the insulating layer. This prevents generation of a malfunction of the electronic component.

Moreover, the one or plurality of openings are formed in the region of the metal layer outside the region, which coincides with the mounting region, of the metal layer, thus suppressing propagation of a stress locally applied to part of the printed circuit board at the time of mounting the electronic component, for example, to the entire printed circuit board through the metal layer. This prevents disconnection caused by detachment of part of the conductive trace from the insulating layer, and prevents separation of the electronic component from the conductive trace. As a result, generation of a poor connection between the conductive trace and the electronic component is prevented.

In addition, the one or plurality of openings are formed such that the metal layer is not divided, so that a decrease in a transmission efficiency of heat in the metal layer is suppressed. Accordingly, heat dissipation through the metal layer can be sufficiently secured while good connection between the conductive trace and the electronic component can be sustained.

(2) The one or plurality of openings may be formed such that the region, which coincides with the mounting region, of the metal layer is sandwiched between the one or plurality of openings.

In this case, propagation of the stress applied to the mounting region to a region outside the mounting region through the metal layer is suppressed. Moreover, propagation of the stress applied to the outside of the mounting region to the mounting region through the metal layer is suppressed. This efficiently suppresses propagation of the stress in the metal layer with a simple configuration.

(3) The printed circuit board according to claim 1, wherein said one or plurality of openings include one or plurality of slits having a line shape, and at least one of one end and the other end of each of said one or plurality of slits is spaced apart from an edge of said metal layer.

In this case, the one or plurality of openings are the one or plurality of slits having the line shape, so that a sufficient area of the metal layer can be secured. In addition, since the at least one of the one end and the other end of each of the one or plurality of slits is spaced apart from the edge of the metal layer, the metal layer is not divided by the one or plurality of slits. Accordingly, propagation of the stress in the metal layer can be sufficiently suppressed by the one or plurality of slits while heat dissipation through the metal layer can be sufficiently secured.

(4) The mounting region may have a rectangular shape, and the one or plurality of slits may include first and second slits that linearly extend, respectively, along one and the other of a pair of sides, being parallel to each other, of the mounting region.

In this case, propagation of the stress in the metal layer can be sufficiently suppressed while heat dissipation through the metal layer can be secured with a simple configuration.

(5) A width of the first and second slits may be larger than 0.1 mm and smaller than 2 mm. In this case, propagation of the stress in the metal layer can be more sufficiently suppressed.

(6) A length of the first and second slits may be longer than a length of the pair of sides of the mounting region by at least 1 mm. In this case, propagation of the stress in the metal layer can be more sufficiently suppressed.

(7) A length of the first and second slits may be at most two-thirds of a length of the metal layer in a direction parallel to the pair of sides of the mounting region. In this case, heat dissipation through the metal layer can be more sufficiently secured.

(8) Each of distances between the first and second slits and the region, which coincides with the mounting region, of the metal layer may be larger than 2 mm and smaller than 5 mm. In this case, the propagation of the stress in the metal layer can be sufficiently suppressed while sufficient heat dissipation through the metal layer can be secured.

(9) According to another aspect of the present invention, a method of manufacturing a printed circuit board having a mounting region on which an electronic component is to be mounted includes the steps of forming on one surface of an insulating layer a conductive trace that is to be electrically connected to the electronic component, and forming on the other surface of the insulating layer a metal layer having one or plurality of openings, where in the one or plurality of openings are arranged in a region of the metal layer outside a region, which coincides with the mounting region, of the metal layer, and formed such that the metal layer is not divided.

In this method of manufacturing the printed circuit board, the conductive trace is formed on the one surface of the insulating layer, and the metal layer is formed on the other surface of the insulating layer. In this case, the heat of the electronic component connected to the conductive trace is dissipated through the metal layer. This prevents generation of a malfunction of the electronic component.

Moreover, the one or plurality of openings are formed in the region of the metal layer outside the region, which coincides with the mounting region, of the metal layer, thus suppressing propagation of a stress locally applied to part of the printed circuit board at the time of mounting the electronic component, for example, to the entire printed circuit board through the metal layer. This prevents disconnection caused by detachment of part of the conductive trace from the insulating layer and prevents separation of the electronic component from the conductive trace. As a result, generation of a poor connection between the conductive trace and the electronic component is prevented.

In addition, the one or plurality of openings are formed such that the metal layer is not divided, so that a decrease in a transmission efficiency of heat in the metal layer is suppressed. Accordingly, good connection between the conductive trace and the electronic component can be sustained while heat dissipation through the metal layer can be sufficiently secured.

According to the present invention, dissipation of the heat of the electronic component through the metal layer formed on the other surface of the insulating layer prevents generation of the malfunction of the electronic component. In addition, good connection between the conductive trace and the electronic component can be sustained while sufficient heat dissipation through the metal layer can be secured.

Other features, elements, characteristics, and advantages of the present invention will become more apparent from the following description of preferred embodiments of the present invention with reference to the attached drawings.

DESCRIPTION OF THE PREFERRED EMBODIMENTS

Hereinafter, a printed circuit board and a method of manufacturing the same according to one embodiment of the present invention will be described while referring to the drawings. Note that a substrate for COF (Chip On Film) (hereinafter referred to as a COF substrate) is described as one example of the printed circuit board in the present embodiment.

(1) Configuration

Figure 1:
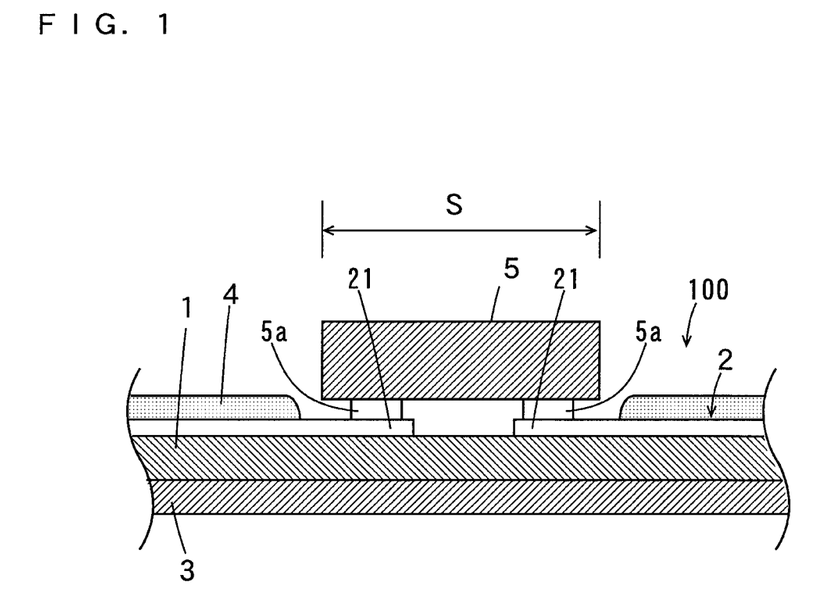
FIG. 1 is a sectional view of a COF substrate according to the present embodiment.
Figure 2:
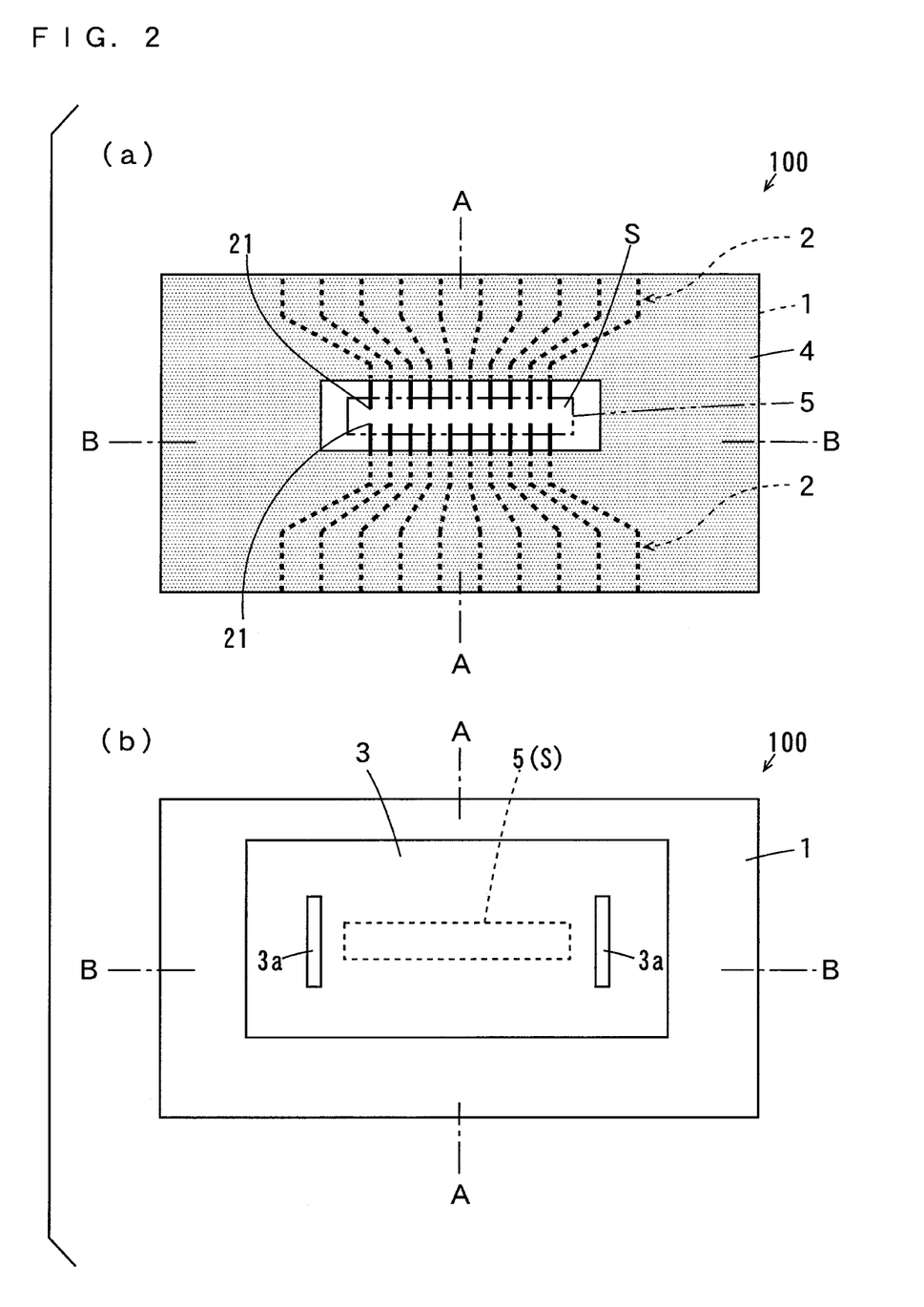
FIG. 2 is a plan view of the COF substrate according to the present embodiment.

FIG. 1 is a sectional view of the COF substrate according to the present embodiment, and FIG. 2 is a plan view of the COF substrate according to the present embodiment. Note that FIG. 2 (*a*) shows an upper surface of the COF substrate of FIG. 1, and FIG. 2 (*b*) shows a lower surface of the COF substrate of FIG. 1. The sectional view taken along the line A-A of FIG. 2 (*a*) and (*b*) corresponds to the sectional view of FIG. 1.

As shown in FIGS. 1 and 2, the COF substrate 100 includes an insulating layer 1 made of polyimide, for example. A mounting region S is provided at an approximately center of one surface of the insulating layer 1. Conductive traces 2 are formed so as to outwardly extend from inside of the mounting region S. Note that the conductive traces 2 include signal lines for transmitting electrical signals and dummy lines not transmitting electrical signals. A cover insulating layer 4 is formed in a periphery of the mounting region S so as to cover the conductive traces 2. Terminals 21 of the conductive traces 2 are arranged in the mounting region S.

An electronic component 5 (an LSI (Large Scale Integration), for example) is mounted on the insulating layer 1 so as to coincide with the mounting region S. Specifically, bumps 5*a* (FIG. 1) of the electronic component 5 are bonded to the terminals 21 of the conductive traces 2. The shape of the mounting region S is set so as to be the same as the shape of the electronic component 5 in planar view. In this example, the electronic component 5 having a rectangular shape is used.

As shown in FIG. 2 (*b*), a metal layer 3 made of copper, for example, is provided on the other surface of the insulating layer 1. A pair of slits 3*a* is formed in the metal layer 3 such that a region being opposite to the electronic component 5 is sandwiched therebetween.

Each slit 3*a* is formed so as not to divide the metal layer 3 into a plurality of regions. That is, at least one of one end and the other end of each slit 3*a* is spaced apart from four sides of the metal layer 3.

In this COF substrate 100, heat generated in the electronic component 5 is transmitted to the metal layer 3 through the insulating layer 1 to be dissipated. Since the heat does not stay in the electronic component 5 and its periphery, generation of a malfunction of the electronic component 5 is prevented.

(2) Detailed Shape of the Slit

Figure 3:
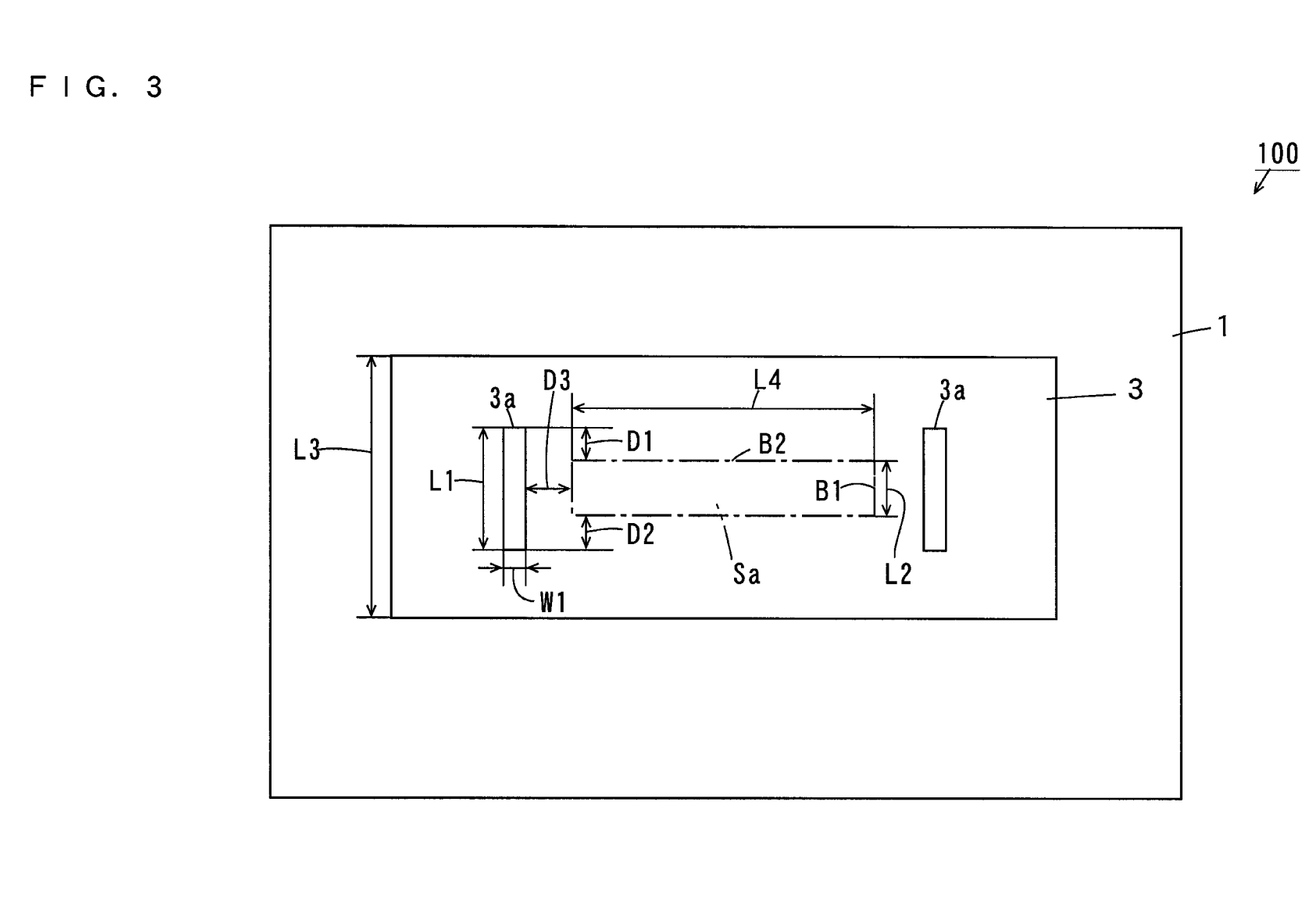
FIG. 3 is a plan view for explaining the detailed shape of a slit formed in a metal layer 3.

FIG. 3 is a plan view for explaining the detailed shape of the slit 3a formed in the metal layer 3. In the following description, a rectangular region (a region indicated by the one-dot and dash line in FIG. 3), which is opposite to the electronic component 5, of the metal layer 3 is referred to as an opposite region Sa, a direction parallel to the shorter sides B1 of the opposite region Sa is referred to as a short-side direction, and a direction parallel to the longer sides B2 of the opposite region Sa is referred to as a long-side direction. Note that the shape of the opposite region Sa is the same as the shape of the electronic component 5 in planar view.

In FIG. 3, the width W1 of each slit 3a is preferably larger than 0.1 mm and smaller than 2 mm. Moreover, each slit 3a is preferably parallel to the short-side direction, and the length L1 of each slit 3a is preferably larger than the length L2 of the shorter sides B1 of the opposite region Sa by at least 1 mm. In addition, the length L1 of each slit 3a is preferably at most two-thirds of the length L3 of the metal layer 3 in the short-side direction.

Furthermore, the distance D1 in the short-side direction between one end of each slit 3a and the opposite region Sa and the distance D2 in the short-side direction between the other end of each slit 3a and the opposite region Sa are preferably at least 0.5 mm, respectively. The distance D3 in the long-side direction between each slit 3a and the opposite region Sa is preferably larger than 2 mm and smaller than 5 mm.

(3) Manufacturing Method

Figure 4:
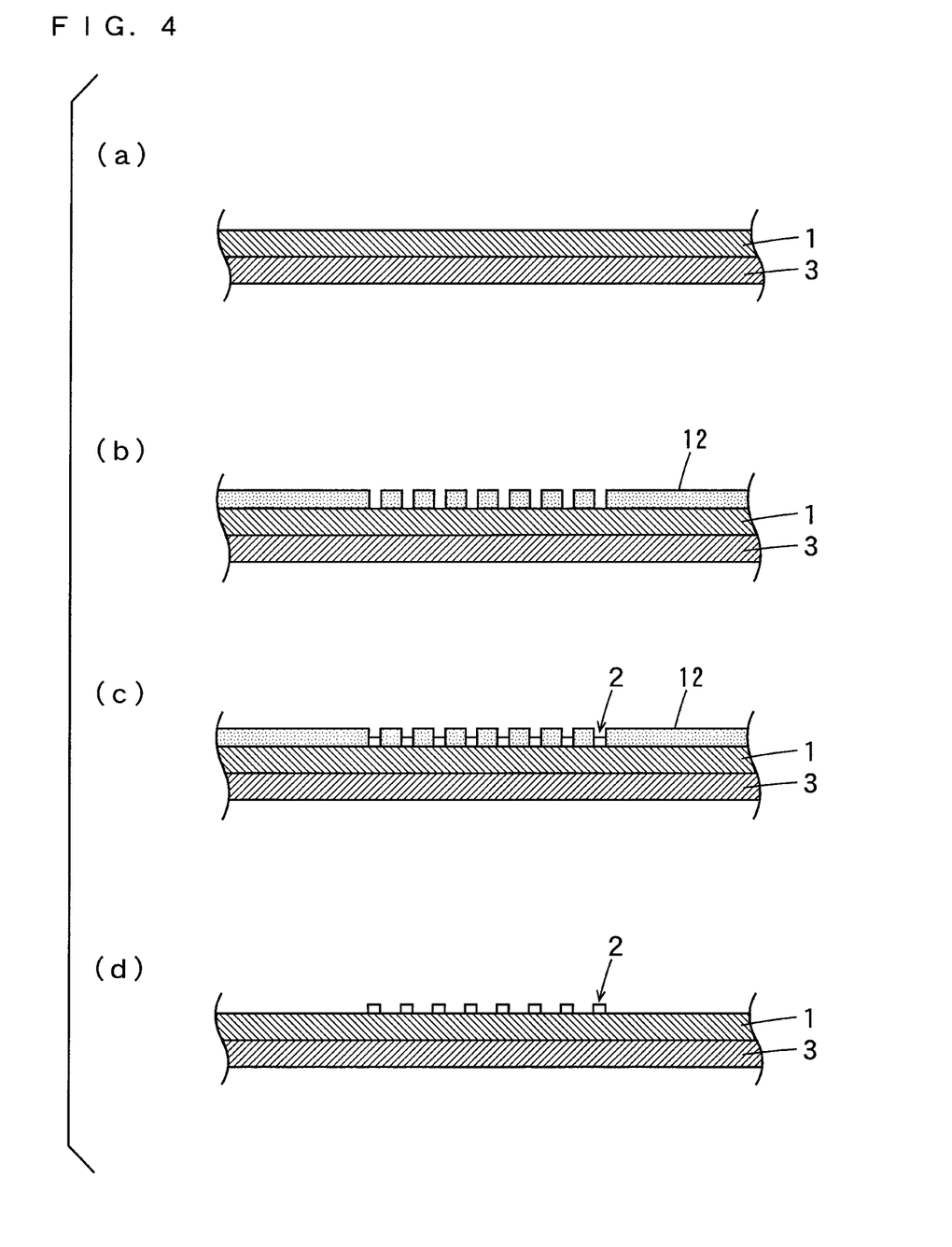
FIG. 4 is a sectional view for explaining steps in a method of manufacturing the COF substrate according to the present embodiment.
Figure 5:
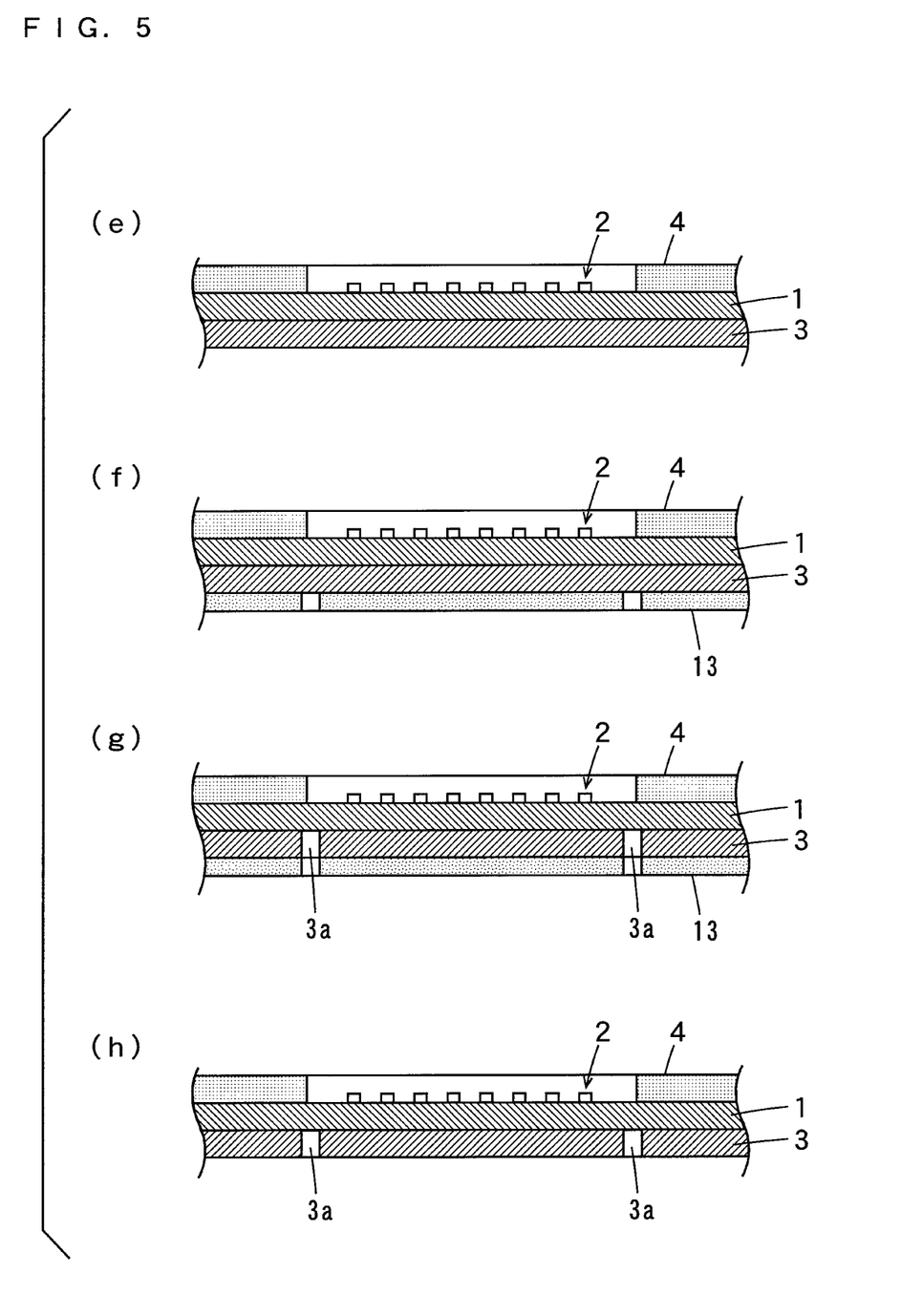
FIG. 5 is a sectional view for explaining steps in the method of manufacturing the COF substrate according to the present embodiment.

Next, description is made of one example of the method of manufacturing the COF substrate 100 according to the present embodiment. FIGS. 4 and 5 are sectional views for explaining steps in the method of manufacturing the COF substrate 100 according to the present embodiment. The cross section shown in FIGS. 4 and 5 corresponds to the cross section taken along the line B-B of FIG. 2.

As shown in FIG. 4 (*a*), a two-layer base material composed of polyimide and copper is prepared. This two-layer base material corresponds to the insulating layer 1 and the metal layer 3 of the COF substrate 100.

First, a thin metal film (not shown) is formed by sputtering on an upper surface of the insulating layer 1. Then, a dry film resist 12 having a reverse pattern of the conductive traces 2 (FIG. 1) is formed on the thin metal film as shown in FIG. 4 (*b*). The reverse pattern is formed by exposure and development of the dry film resist 12.

Then, the conductive traces 2 are formed by electrolytic plating on exposed portions of the insulating layer 1 (exposed portions of the thin metal film) as shown in FIG. 4 (*c*). Then, the dry film resist 12 is removed by a stripping liquid while a region, under the dry film resist 12, of the thin metal film is removed by etching as shown in FIG. 4 (*d*).

Electroless tin plating is subsequently performed on surfaces of the conductive traces 2 as surface treatment for connection with the electronic component 5. Then, the cover insulating layer 4 is formed so as to cover a predetermined region of the conductive traces 2 as shown in FIG. 5 (*e*).

Next, a dry film resist 13 is formed on a lower surface of the metal layer excluding regions in which the slits are to be formed, as shown in FIG. 5 (*f*). Then, the exposed portions of the metal layer 3 are etched to form the slits 3a as shown in FIG. 5 (*g*). After that, the dry film resist 13 is removed by the stripping liquid as shown in FIG. 5 (*h*). In this manner, the COF substrate 100 according to the present embodiment is completed.

While a semi-additive method by which the conductive traces 2 are formed is described as an example, the conductive traces 2 may be formed by a subtractive method.

(4) Effects of the Embodiment

In the present embodiment, the pair of slits 3a is formed in the metal layer 3 such that the region being opposite to the electronic component 5 is sandwiched therebetween. This prevents propagation of a stress locally applied to part of the COF substrate 100 to the entire COF substrate 100 through the metal layer 3 at the time of mounting the electronic component 35 or folding the COF substrate 100, for example.

Specifically, a stress applied to a region, on an outer side of the pair of slits 3a, of the COF substrate 100 is prevented from being propagated to a region, on an inner side of the pair of slits 3a, of the COF substrate 100. Moreover, a stress applied to the region, on the inner side of the pair of slits 3a, of the COF substrate 100 is prevented from being propagated to the region, on the outer side of the pair of slits 3a, of the COF substrate 100. This prevents disconnection caused by detachment of part of the conductive traces 2 from the insulating layer 1 and separation of the bumps 5a of the electronic component 5 from the terminals 21 of the conductive traces 2.

When the metal layer 3 is divided by the slit 3a, the transmission efficiency of heat in the metal layer 3 is decreased, leading deterioration of heat dissipation. Therefore, the slits 3a are formed such that the metal layer 3 is not divided in the present embodiment. This suppresses propagation of the stress without deterioration of heat dissipation.

Accordingly, heat dissipation can be sufficiently improved while good connection between the electronic component and the conductive traces 2 is sustained.

(5) Inventive Examples and Comparative Examples

In the above-described COF substrate 100, the width W1 and the length L1 of the slits 3a and the distance D3 in the long-side direction between each slit 3a and the opposite region Sa (see FIG. 3) were set to respective various values, and connectivity between the COF substrate 100 and the electronic component 5 and heat dissipation of the COF substrate 100 were examined.

Note that polyimide was used as a material for the insulating layer 1, and copper was used as a material for the conductive traces 2 and the metal layer 3. The thicknesses of the insulating layer 1 and the metal layer 3 were 35 μm and 15 μm, respectively. The width of each signal line of the conductive traces 2 was 8 μm, and the distance between the adjacent signal lines in the mounting region S was 12 μm. The length L2 of the shorter sides B1 of the opposite region Sa was 1.6 mm, and the length L4 of the longer sides B2 of the opposite region Sa was 15.1 mm. That is, the electronic component 5 having the shorter sides of 1.6 mm and the longer sides of 15.1 mm, in planar view, was used. The length L3 of the metal layer 3 in the short-side direction was 15 mm.

(5-1) Inventive Examples

The respective set values of the width W1, the lengths L1, L2, L3 and the distance D3 (see FIG. 3) in the inventive examples 1 to 10 are shown in Table 1.

TABLE 1

| | Inventive Example 1 | Inventive Example 2 | Inventive Example 3 | Inventive Example 4 | Inventive Example 5 |
|---|---|---|---|---|---|
| W1 [mm] | 0.1 | 0.2 | 1 | 1.5 | 1 |
| L1 [mm] | 7 | 7 | 7 | 7 | 1 |
| L2 [mm] | 1.6 | 1.6 | 1.6 | 1.6 | 1.6 |
| L3 [mm] | 15 | 15 | 15 | 15 | 15 |
| D3 [mm] | 3 | 3 | 3 | 3 | 3 |

TABLE 1-continued

|  | Inventive Example 6 | Inventive Example 7 | Inventive Example 8 | Inventive Example 9 | Inventive Example 10 |
|---|---|---|---|---|---|
| W1 [mm] | 1 | 1 | 1 | 1 | 1 |
| L1 [mm] | 3 | 10 | 13 | 7 | 7 |
| L2 [mm] | 1.6 | 1.6 | 1.6 | 1.6 | 1.6 |
| L3 [mm] | 15 | 15 | 15 | 15 | 15 |
| D3 [mm] | 3 | 3 | 3 | 3 | 4 |

As shown in Table 1, the length L1 was set to 7 mm, the distance D3 was set to 3 mm, and the width W1 was set to 0.1 mm, 0.2 mm, 1 mm and 1.5 mm, respectively, in the inventive examples 1 to 4. The width W1 was set to 1 mm, the distance D3 was set to 3 mm, and the length L1 was set to 1 mm, 3 mm, 10 mm and 13 mm, respectively, in the inventive examples 5 to 8. The width W1 was set to 1 mm, the length L1 was set to 7 mm, and the distance D3 was set to 3 mm and 4 mm, respectively, in the inventive examples 9, 10.

(5-2) Comparative Examples

The respective set values of the width W1, the lengths L1, L2, L3 and the distance D3 (see FIG. 3) in the comparative examples 1, 2 are shown in Table 2.

TABLE 2

|  | Comparative Example 1 | Comparative Example 2 |
|---|---|---|
| W1 [mm] | 0 | 1 |
| L1 [mm] | 0 | 15 |
| L2 [mm] | 1.6 | 1.6 |
| L3 [mm] | 15 | 15 |
| D3 [mm] | 0 | 3 |

As shown in Table 2, the slits 3a were not formed in the metal layer 3 in the comparative example 1. In the comparative example 2, the slits 3a were formed so as to divide the metal layer 3 while the width W1 and the distance D3 were set to 1 mm and 3 mm, respectively.

(5-3) Evaluation

The disconnection rate of the conductive traces 2 and the degree of heat dissipation at the time of mounting the electronic component 5 in the COF substrate 100 of the inventive examples 1 to 8 and the comparative examples 1, 2 were examined.

Note that at the time of mounting, a tool temperature was 430° C., a stage temperature was 100° C., and a mounting load was 30 N. Here, the tool temperature is a heating temperature of the terminals 21 of the conductive traces 2 or the bumps 5a of the electronic component 5, and the stage temperature is a temperature of a stage on which the COF substrate 100 is placed at the time of mounting the electronic component 5.

Table 3 shows the disconnection rates of the conductive traces 2 in the inventive examples 1 to 8 and the comparative examples 1, 2.

TABLE 3

|  | Inventive Example 1 | Inventive Example 2 | Inventive Example 3 | Inventive Example 4 |
|---|---|---|---|---|
| Disconnection rate [%] | 40 | 0 | 0 | 0 |

|  | Inventive Example 5 | Inventive Example 6 | Inventive Example 7 | Inventive Example 8 |
|---|---|---|---|---|
| Disconnection rate [%] | 30 | 0 | 0 | 0 |

|  | Inventive Example 9 | Inventive Example 10 |
|---|---|---|
| Disconnection rate [%] | 0 | 0 |

|  | Comparative Example 1 | Comparative Example 2 |
|---|---|---|
| Disconnection rate [%] | 90 | 0 |

As shown in Table 3, the disconnection rates were lower in the inventive examples 1 to 10 than in the comparative example 1. These results show that the better connection was sustained between the conductive traces 2 and the electronic component when the slits 3a were formed in the metal layer 3 than when the slits 3a were not formed.

Moreover, the heat of the electronic component 5 was moderately dissipated in the inventive examples 1 to 8, while the heat of the electronic component 5 was not dissipated in the comparative example 2. This shows that the better heat dissipation was secured when the metal layer 3 was not divided by the slits 3a than when the metal layer 3 was divided by the slits 3a.

In addition, the results of the inventive examples 1 to 4 show that the better connection was sustained between the conductive traces 2 and the electronic component 5 when the width W1 of the slits 3a was set in the range from 0.2 to 1.5 mm than when the width W1 of the slits 3a was set to 1 mm.

Furthermore, the results of the inventive examples 5 to 8 show that the better connection was sustained between the conductive traces 2 and the electronic component 5 when the length L1 of the slits 3a was set in the range from 3 to 13 mm than when the length L1 of the slits 3a was set to 1 mm.

Moreover, the results of the inventive examples 9, 10 show that the better connection between the conductive traces 2 and the electronic component 5 was sustained when the distance D3 in the long-side direction between each slit 3a and the opposite region Sa was set in the range from 3 to 4 mm.

(6) Modifications of the Slits

Figure 6:
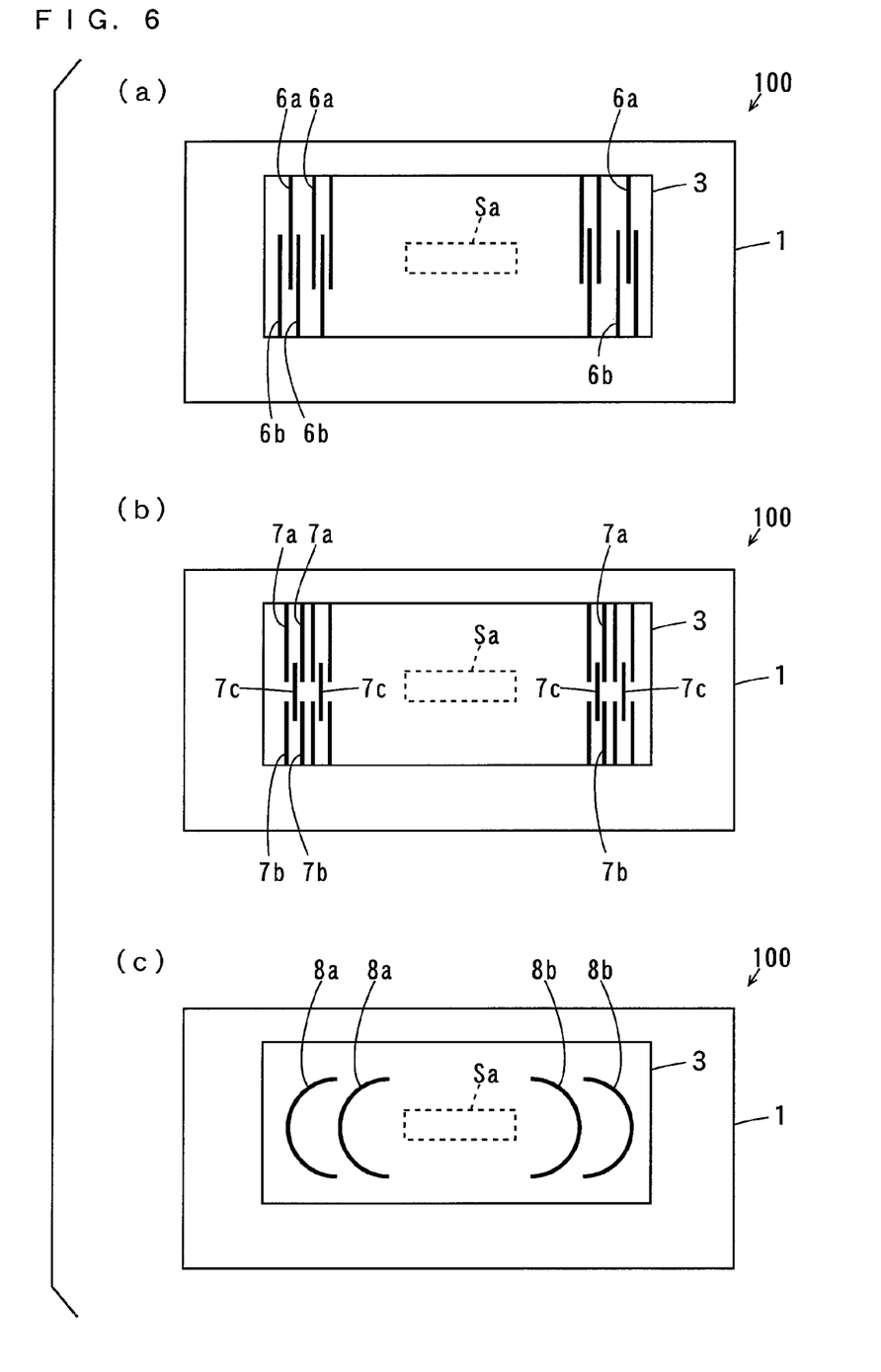
FIG. 6 is a diagram showing modifications of the slit formed in the metal layer.

The arrangement and shape of the slits 3a formed in the metal layer 3 are not limited to the foregoing example. FIG. 6 is a diagram showing modifications of the slits 3a formed in the metal layer 3.

In the example of FIG. 6 (a), a plurality of slits 6a extend a predetermined length in the short-side direction from one longer side of the metal layer 3, and a plurality of slits 6b extend a predetermined length in the short-side direction from the other longer side of the metal layer 3 in one region and the other region between which the opposite region Sa is sandwiched. The slits 6a and the slits 6b are alternately arranged so as not to coincide with one another. Also in this example, the propagation of the stress in the metal layer 3 can be sufficiently suppressed by the slits 6a, 6b. Moreover, since the metal layer 3 is not divided by the slits 6a, 6b, good heat dissipation can be sustained.

In the example of FIG. 6 (b), a plurality of slits 7a extend a predetermined length in the short-side direction from one longer side of the metal layer 3, and a plurality of slits 7b extend a predetermined length in the short-side direction from the other longer side of the metal layer 3 so as to correspond to the plurality of slits 7a, respectively, in one region and the other region between which the opposite region Sa is sandwiched. Each slit 7a and the slit 7b corresponding thereto are arranged on the same straight line so as to be spaced from each other. Each of slits 7c is formed in a region at the center in the short-side direction and between adjacent two pairs of slits 7a, 7b. Also in this example, the propagation of the stress in the metal layer 3 can be sufficiently suppressed by the slits 7a, 7b, 7c. Moreover, since the metal layer 3 is not divided by the slits 7a, 7b, 7c, good heat dissipation can be sustained.

In the example of FIG. 6 (c), a plurality of slits 8a and a plurality of slits 8b each having a substantially circular arc shape are formed in one region and the other region, respectively, between which the opposite region Sa is sandwiched. The slits 8a and the slits 8b are formed symmetrically to one another with respect to the opposite region Sa. Also in this example, the propagation of the stress in the metal layer 3 can be sufficiently suppressed by the slits 8a, 8b. Moreover, since the metal layer 3 is not divided by the slits 8a, 8b, good heat dissipation can be sustained.

The position, number and shape of the slits are not limited to the above-described examples, and may be suitably changed depending on the shape, size or the like of the electronic component 5. In addition, an opening having another shape such as a round shape or a triangular shape instead of the linear slit may be formed in the metal layer 3.

(7) Correspondences between Elements in the Claims and Parts in Embodiments

In the following paragraph, non-limiting examples of correspondences between various elements recited in the claims below and those described above with respect to various preferred embodiments of the present invention are explained.

In the above-described embodiment, the COF substrate 100 is an example of a printed circuit board, the slits 3a, 6a, 6b, 7a, 7b, 7c, 8a, 8b are examples of an opening, and the slits 3a are examples of first and second slits.

As each of various elements recited in the claims, various other elements having configurations or functions described in the claims can be also used.

(8) Other Embodiments

The material for the insulating layer 1 is not limited to polyimide. For example, another insulating material such as polyethylene terephthalate, polyethernitrile, polyethersulfone may be used. Moreover, the material for the conductive traces 2 is not limited to copper. For example, another metal material such as copper alloy, gold, aluminum may be used.

The material for the metal layer 3 is not limited to copper. For example, metal having high thermal conductivity such as copper, gold, silver or aluminum is preferably used.

The present invention is applicable to various printed circuit boards such as a flexible printed circuit board and a rigid printed circuit board. Moreover, the electronic component 5 is not limited to an LSI. For example, another electronic component such as a capacitor may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board having a mounting region on which an electronic component is to be mounted, comprising:
   an insulating layer;
   a conductive trace formed on a first major surface of said insulating layer for transmitting electrical signals, the conductive trace being electrically connected to said electronic component; and
   a metal layer formed on and facing an oppositely facing second major surface of said insulating layer and having first and second openings, wherein
   said first and second openings are formed such that a region of said metal layer that coincides with said mounting region is sandwiched between said first and second openings, and formed such that said metal layer is not divided,
   said mounting region has first and second sides that are parallel to each other,
   said first opening is arranged on a side of said first side of said mounting region and has a length longer than said first side in a direction parallel to said first side, and
   said second opening is arranged on a side of said second side of said mounting region and has a length longer than said second side in a direction parallel to said second side.

2. The printed circuit board according to claim 1, wherein said first opening includes a first slit having a line shape,
   said second opening includes a second slit having a line shape, and
   at least one of one end and the other end of each of said first and second slits is spaced apart from an edge of said metal layer.

3. The printed circuit board according to claim 2, wherein said mounting region has a rectangular shape having said first and second sides, and
   said first and second slits linearly extend, respectively, along said first and second sides.

4. The printed circuit board according to claim 3, wherein a width of said first and second slits is larger than 0.1 mm and smaller than 2 mm.

5. The printed circuit board according to claim 2, wherein a length of said first and second slits is longer than a length of said first and second sides of said mounting region by at least 1 mm.

6. The printed circuit board according to claim 2, wherein a length of said first and second slits is at most two-thirds of a length of said metal layer in a direction parallel to said first and second sides of said mounting region.

7. The printed circuit board according to claim 2, wherein a distance between each of said first and second slits and the region, which coincides with said mounting region, of said metal layer is larger than 2 mm and smaller than 5 mm.

8. A method of manufacturing a printed circuit board having a mounting region on which an electronic component is to be mounted, comprising the steps of:
   forming on a first major surface of an insulating layer a conductive trace for transmitting electrical signals, the conductive trace being electrically connected to said electronic component; and
   forming on an oppositely facing second major surface of said insulating layer a metal layer facing the insulating layer, the metal layer having first and second openings, wherein said first and second openings are formed such that a region of said metal layer that coincides with said mounting region is sandwiched between said first and second openings, and formed such that said metal layer is not divided, said mounting region has first and second sides that are parallel to each other, said first opening is arranged on a side of said first side of said mounting region and has a length longer than said first side in a direction parallel to said first side, and said second opening is arranged on a side of said second side of said mounting region and has a length longer than said second side in a direction parallel to said second side.

9. A printed circuit board having a mounting region on which an electronic component is mounted, comprising:

an insulating layer;

a conductive trace formed on one surface of the insulating layer and electrically connected to the electronic component; and a metal layer formed on an oppositely facing surface of the insulating layer, the metal layer having at least first and second slits each having a line shape and spaced apart from an edge of the metal layer, wherein the mounting region has a rectangular shape and the first and second slits each extend linearly along one of a pair of parallel sides of the mounting region, and wherein the first and second slits are arranged in a region of the metal layer outside a region which coincides with the mounting region of the metal layer and formed such that the metal layer is not divided.

10. The printed circuit board according to claim 9, wherein a width of each of the first and second slits is larger than 0.1 mm and smaller than 2 mm.

11. The printed circuit board according to claim 9, wherein a length of each of the first and second slits is longer than a length of the pair of parallel sides of the mounting region by at least 1 mm.

12. The printed circuit board according to claim 9, wherein a length of each of the first and second slits is two-thirds or less of a length of the metal layer in a direction parallel to the pair of parallel sides of the mounting region.

13. The printed circuit board according to claim 9, wherein a distance between each of the first and second slits and the region which coincides with the mounting region of the metal layer is larger than 2 mm and smaller than 5 mm.

* * * * *